(12) United States Patent
Tamagawa et al.

(10) Patent No.: US 9,627,527 B2
(45) Date of Patent: *Apr. 18, 2017

(54) SEMICONDUCTOR DEVICE

(71) Applicant: Renesas Electronics Corporation, Tokyo (JP)

(72) Inventors: Akio Tamagawa, Tokyo (JP); Makoto Tanaka, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/071,789

(22) Filed: Mar. 16, 2016

(65) Prior Publication Data

US 2016/0197179 A1 Jul. 7, 2016

Related U.S. Application Data

(63) Continuation of application No. 14/526,113, filed on Oct. 28, 2014, now Pat. No. 9,324,788.

(30) Foreign Application Priority Data

Oct. 30, 2013 (JP) ................. 2013-225789

(51) Int. Cl.
*H01L 29/78* (2006.01)
*H01L 29/06* (2006.01)
(Continued)

(52) U.S. Cl.
CPC .. *H01L 29/7813* (2013.01); *H01L 21/823481* (2013.01); *H01L 24/49* (2013.01); *H01L 25/18* (2013.01); *H01L 27/088* (2013.01); *H01L 29/0615* (2013.01); *H01L 29/0646* (2013.01); *H01L 29/086* (2013.01); *H01L 29/0865* (2013.01); *H01L 29/0878* (2013.01); *H01L 29/0882* (2013.01); *H01L 29/1095* (2013.01); *H01L 29/41741* (2013.01);
(Continued)

(58) Field of Classification Search
CPC ............ H01L 29/7813; H01L 29/0878; H01L 29/41741; H01L 29/086; H01L 29/4236; H01L 29/0882
USPC ....................................... 257/334
See application file for complete search history.

(56) References Cited

U.S. PATENT DOCUMENTS 5,900,652 A 5/1999 Battaglia et al.
6,090,669 A 7/2000 Franco et al.
(Continued)

FOREIGN PATENT DOCUMENTS

JP 6-151740 A 5/1994

*Primary Examiner* — Fernando L Toledo
*Assistant Examiner* — Adam S Bowen
(74) *Attorney, Agent, or Firm* — Sughrue Mion, PLLC

(57) ABSTRACT

In a semiconductor device, a lightly doped second semiconductor layer of a first conductive type is joined with a heavily doped first semiconductor layer of the first conductive type. A power transistor having a first conductive type channel and a transistor are formed in surface regions of the second semiconductor layer, respectively. A first diffusion layer of a second conductive type is formed in a surface region of the second semiconductor layer to provide a boundary between the power transistor and the transistor. The first semiconductor layer functions as a drain of the power transistor. The first diffusion layer region is set to the same voltage as that of the drain.

16 Claims, 14 Drawing Sheets

(51) Int. Cl.
    *H01L 27/088*     (2006.01)
    *H01L 21/8234*     (2006.01)
    *H01L 23/00*     (2006.01)
    *H01L 25/18*     (2006.01)
    *H01L 29/08*     (2006.01)
    *H01L 29/10*     (2006.01)
    *H01L 29/417*     (2006.01)
    *H01L 29/423*     (2006.01)

(52) U.S. Cl.
    CPC ...... *H01L 29/4236* (2013.01); *H01L 29/7811* (2013.01); *H01L 24/45* (2013.01); *H01L 2224/45124* (2013.01); *H01L 2224/48137* (2013.01); *H01L 2224/49175* (2013.01); *H01L 2224/73265* (2013.01); *H01L 2924/00014* (2013.01); *H01L 2924/13091* (2013.01)

(56) References Cited

U.S. PATENT DOCUMENTS

| | | | |
|---|---|---|---|
| 9,324,788 B2 * | 4/2016 | Tamagawa | H01L 29/0646 |
| 2011/0163374 A1 | 7/2011 | Tang et al. | |
| 2012/0112240 A1 | 5/2012 | Takeda et al. | |
| 2013/0154123 A1 * | 6/2013 | Poh | H01L 23/49575 257/782 |
| 2014/0042535 A1 | 2/2014 | Darwish et al. | |

* cited by examiner

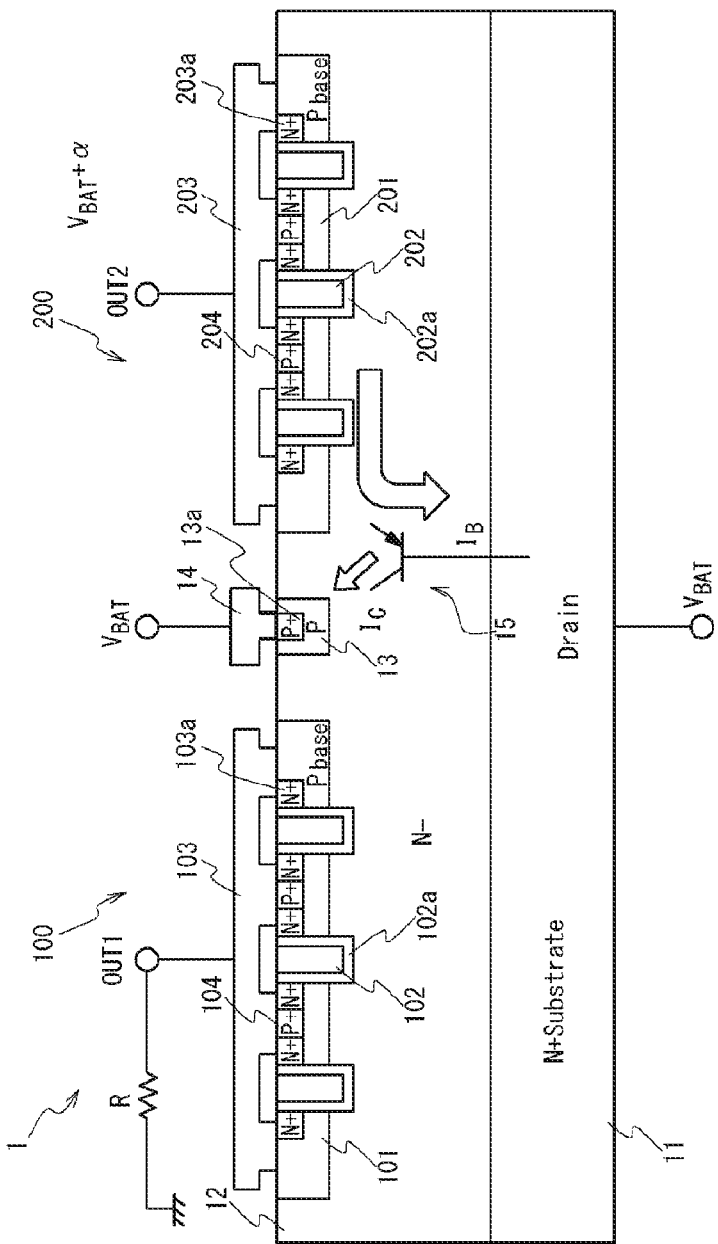

SEMICONDUCTOR DEVICE

CROSS-REFERENCE

This application is a continuation application of U.S. application Ser. No. 14/526,113, filed on Oct. 28, 2014, which claims priority from Japanese patent application No. 2013-225789 filed on Oct. 30, 2013, the contents of all of which are incorporated herein by reference in their entirety.

TECHNICAL FIELD

The present invention is related to a semiconductor device, and especially is suitably used for an intelligent power device (IPD).

BACKGROUND ART

In recent years, relays which are used for an engine control unit for a car electric system are replaced with semiconductor devices such as power MOSFETs and so on to eliminate the contacts. As a recent device, IPD has been used in which protection functions such as functions of a current limitation circuit, an overheating detection circuit and an open load detection circuit are built in the power MOSFET. A self-diagnosis result can be transferred to a microcomputer on a control side. The IPD is requested to reduce the power consumption while suppressing the increase of a circuit area.

For example, Patent Literature 1 (JP H06-151740A) discloses a power semiconductor device. The power semiconductor device includes a semiconductor substrate, a plurality of power transistors, at least one diffusion layer and a trench separation oxide film. The semiconductor substrate has a first substrate of a high concentration and a substrate which is used for a common drain and a second substrate of a low concentration joined with the first substrate. The plurality of power transistors are formed on a main surface of the second substrate to divide the area. At least one diffusion layer is formed to be buried in the second substrate in correspondence to a boundary of the plurality of power transistors to divide the region of the plurality of power transistors. A trench separation oxide film is buried in the ditch which is formed in the second substrate in a depth to the first substrate in correspondence to the diffusion layer. The minimum voltage is set to the diffusion layer for the plurality of power transistors. Thus, the phenomenon can be prevented in which a parasitic transistor of the adjacent power transistors is turned on so that parasitic current flows from the source of one of the power transistors into the source of the other power transistor.

CITATION LIST

[Patent Literature 1] JP H06-151740A

SUMMARY OF THE INVENTION

In the power semiconductor device in Patent Literature 1, the trench separation oxide film and the P-type diffusion layer are arranged between the first power transistor and the second power transistor. In this case, each power transistor is V-DMOS (Vertical-Diffused MOS) transistor. Also, a P-type diffusion layer needs to be grounded. Therefore, when a multi-chip configuration is adopted in which the power semiconductor device (power transistor chip) and a control chip are arranged in a row, the GND pad needs to be provided in the power semiconductor device. In this case, the chip area increases by a pad area.

Also, in the power semiconductor device, in order to reduce the power consumption, the resistance of an aluminum interconnection between the P-type diffusion layer and the GND pad needs to be reduced. For this purpose, it is necessary to shorten the interconnection, or to provide a plurality of GND pads. In this case, the chip area further increases by an area of the plurality of pads. A technique is required in which the parasitic current is reduced to make the power consumption small while restraining the increase of the circuit area.

According to one embodiment, a first diffusion layer region of a second conductive type is provided between a power transistor having a first conductive type channel and a transistor having a diffusion layer of the second conductive type. The voltage of the first diffusion layer region is set to the same voltage as that of the drain of the power transistor.

In the present invention, by reducing the parasitic current while suppressing the increase of a circuit area, the power consumption can be reduced.

BRIEF DESCRIPTION OF THE DRAWINGS

FIG. 1B is a sectional view schematically showing the structure example of the semiconductor device according to a first embodiment.

DESCRIPTION OF THE EMBODIMENTS

Figure 1A:
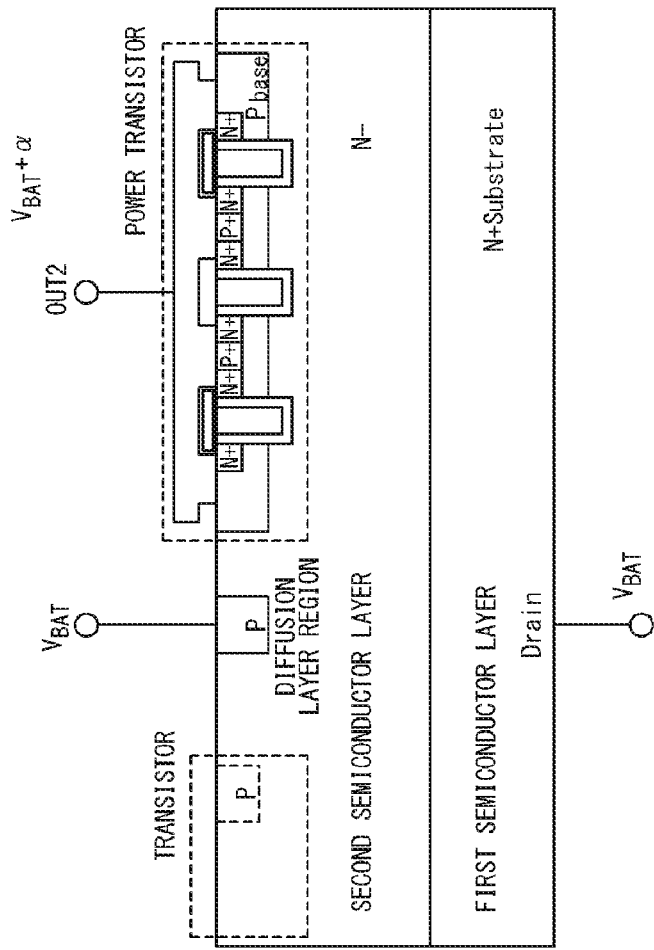
FIG. 1A is a sectional view schematically showing the structure of a semiconductor device according to an embodiment.

Hereinafter, a semiconductor device according to embodiments will be described. FIG. 1A is a sectional view schematically showing the configuration of the semiconductor device according to an embodiment. In FIG. 1A, an example in which a first conductive type is an N-type and a second conductive type is a P-type is shown, but the first and second conductive types may be opposite. Note that numbers and codes with a bracket are used to show the configuration in the embodiments.

The semiconductor device according to the embodiment includes a first semiconductor layer (11), a second semiconductor layer (12), a first power transistor (200) having a channel of a first conductive type (N), a transistor (100, 500/600) and a first diffusion layer region (13, 63). The first semiconductor layer (11) of the first conductive type (N) is of a high impurity concentration (+), i.e., has heavily doped impurity. The second semiconductor layer (12) of the first conductive type (N) is joined on the first semiconductor layer and is of a low impurity concentration (−), i.e. has lightly doped impurity. The first power transistor (200) having the first conductive type (N) channel is formed in a surface region of the second semiconductor layer (12). The transistor (100, 500/600) is formed in the surface region of the second semiconductor layer (12). The first diffusion layer region (13, 63) is of a second conductive type (P) and is formed in the surface region of the second semiconductor layer (12) to provide a boundary between the first power transistor (200) and the transistor (100, 500/600). The first semiconductor layer (11) functions as a drain of the first power transistor (200). The first diffusion layer region (13, 63) is set to the same voltage as that of the drain.

In such a semiconductor device 1, the first semiconductor layer (11)+the second semiconductor layer (12) which is the drain of the first power transistor (200) have a predetermined drain voltage. In this case, when electric noise of the drain voltage+α (α>0: the first conductive type is the N-type, α<0: the first conductive type is the P-type) is applied to the source of the first power transistor (200), the channel region (P) of the first power transistor (200) is biased to a forward direction. Therefore, the phenomenon as if a parasitic (PNP) transistor exists generates in the channel region (P), the second semiconductor layer (12) (N) and a region of the second conductive type (P). However, the region of the second conductive type (P) is the first diffusion layer region (13, 63) or the diffusion layer region of the second conductive type (P) of the transistor (100, 500/600). As a result, by a parasitic current from the channel region (P) as an emitter, the parasitic current flows to the second semiconductor layer (12) as a base and into the region of the second conductive type (P) as a collector. At this time, in the semiconductor device 1 of the present embodiment, the first diffusion layer region (13, 63) of the second conductive type (P) exists in a channel region (P) in front (near) to the diffusion layer region of the second conductive type (P) of the transistor (100, 500/600). Therefore, the parasitic current flows into the first diffusion layer region (13, 63). As a result, the flow of the parasitic current to the transistor (100, 500/600) can be restrained. That is, because the parasitic current can be reduced, the power consumption can be reduced. Also, at this time, the first diffusion layer region (13, 63) is connected with the drain voltage as a destination to release the parasitic current. For example, as the acquisition destination of the drain voltage, the first semiconductor layer (11)+the second semiconductor layer (12) is thought of. Therefore, because it is not necessary to provide a GND pad, the increase of the chip area can be substantially restrained.

Hereinafter, the semiconductor device according to each of the embodiments will be described specifically. Below, a case that the first power transistor is an N-channel high-side output power MOSFET will be described as an example. However, each embodiment is not limited to this example. A case that the first power transistor is a P-channel low-side output power MOSFET and a case that the conductive type of each layer is opposite are will be described in the same way.

First Embodiment

A structure example of the semiconductor device according to a first embodiment will be described. FIG. 1B is a sectional view schematically showing the structure example of the semiconductor device according to the first embodiment. The semiconductor device 1 includes an $N^+$ semiconductor substrate 11, an $N^-$ epitaxial layer 12, an output power MOSFET 100, an output power MOSFET 200 and a P-type diffusion layer region 13.

The $N^+$ semiconductor substrate 11 (as a first semiconductor layer) is an N-type of semiconductor substrate in which an N-type impurity is doped in a high concentration, i.e. is heavily doped. The $N^-$ epitaxial layer 12 (as a second semiconductor layer) is epitaxially grown on the $N^+$ semiconductor substrate 11 and is joined with the $N^+$ semiconductor substrate 11. The $N^-$ epitaxial layer 12 is the N-type of semiconductor layer in which an N-type impurity is doped in a low concentration, i.e. is lightly doped. The output power MOSFET 100 (transistor) is an N-channel V-DMOS (Vertical-Diffused MOS) transistor formed in the surface region of the $N^-$ epitaxial layer 12. The output power MOSFET 200 (as a first power transistor) is an N-channel V-D MOS transistor formed in the surface region of the $N^-$ epitaxial layer 12. The drains of the output power MOSFET 100 and output power MOSFET 200 are the $N^+$ semiconductor substrate 11 and the epitaxial layer 12 and are connected with a higher voltage side power supply voltage. As the higher voltage side power supply voltage, a battery voltage $V_{BAT}$ is exemplified. Below, an example of the battery voltage $V_{BAT}$ will be described (it is same in the other embodiments). The P-type diffusion layer region 13 (as a first diffusion layer region) is a P-type semiconductor layer formed to provide a boundary between the output power MOSFET 100 and the output power MOSFET 200 in the surface region of the $N^-$ epitaxial layer 12. The voltage of the P-type diffusion layer region 13 is connected with the same battery voltage $V_{BAT}$ as the $N^+$ semiconductor substrate 11 and the $N^-$ epitaxial layer 12 by an electrode layer 14 so as to set the drains of the output power MOSFET 100 and the output power MOSFET 200 to the same voltage. Note that when there are three or more output power MOSFETs, the P-type diffusion layer region 13 is formed to provide a boundary between the optional adjacent output power MOSFETs among a plurality of output power MOSFETs.

Also, the channel region of the output power MOSFET 100 has a P-type base layer 101 (base diffusion layer) formed in the surface region of the $N^-$ epitaxial layer 12. A gate includes a polysilicon layer 102 formed to pass through the P-type base layer 101 from the surface side to the inner side, and an insulating layer 102a formed to cover the outer side of the polysilicon layer 102. A source has the N⁺ diffusion layer 103*a* formed on the side surface of the gate in the surface region of the P-type base layer 101, and an electrode 103 formed onto the surface of the N⁺ diffusion layer 103*a*. In the same way, the channel region of the output power MOSFET 200 has a P-type base layer 201 (as a base diffusion layer) formed in the surface region of the N⁻ epitaxial layer 12. A gate has a polysilicon layer 202 formed to pass through the P-type base layer 201 from the surface side to the inner side, and an insulating layer 202*a* formed to cover the outer side of the polysilicon layer 202. The source has the N⁺ diffusion layer 203*a* formed on the side surface of the gate in the surface region of the P-type base layer 201 and an electrode 203 formed on the surface of the N⁺ diffusion layer 203*a*. The electrodes 103 and 203 of these sources function as output terminals OUT1 and OUT2, respectively. A load R is connected between each of the output terminals OUT1 and OUT2 and the GND. That is, the semiconductor device 1 takes the structure of a so-called high-side switch. Therefore, to turn on the output power MOSFET, a voltage boosted by a charge pump is applied to the polysilicon layers 102 and 202 of the gate.

In this the semiconductor device 1, it is supposed that electric noise is applied to the output terminal OUT2 of the output power MOSFET 200 so that the voltage at the output terminal became $V_{BAT}+\alpha$. The N⁺ semiconductor substrate 11 and the N⁻ epitaxial layer 12 are connected with the battery voltage $V_{BAT}$. However, when the voltage $V_{BAT}+\alpha$ which is higher than the battery voltage $V_{BAT}$ is applied to the output terminal OUT2 as the electric noise, the P-type base layer 201 is biased in a forward direction. Therefore, as shown in the drawing, a phenomenon occurs as if the parasitic PNP transistor 15 (emitter: P-type base layer 201; base: epitaxial layer 12 and N⁺ semiconductor substrate 11; collector: P-type base layer 101/P-type diffusion layer region 13) exists. That is, it is considered that the parasitic current flows into the epitaxial layer 12 and the N⁺ semiconductor substrate 11 as the base from the P-type base layer 201 as the emitter and the parasitic current flows into the P-type base layer 101/P-type diffusion layer region 13 as the collector. At this time, in the semiconductor device 1 of this embodiment, the P-type diffusion layer region 13 exists for the P-type base layer 201 in front of (near) the P-type base layer 101. Therefore, the parasitic current flows not into the P-type base layer 101 but the P-type diffusion layer region 13. Thus, it is possible to restrain that the parasitic current flows into the output power MOSFET 100. That is, because the parasitic current which flows into load R through the output power MOSFET 100 can be reduced, the power consumption can be reduced.

Also, at this time, the P-type diffusion layer region 13 is connected with the battery voltage $V_{BAT}$ as the destination of the parasitic current. For example, it is supposed that the N⁺ semiconductor substrate 11 under the P-type diffusion layer region 13 is the destination of the acquisition of the battery voltage $V_{BAT}$. In this case, because the parasitic current which flows into the P-type diffusion layer region 13 can be bypassed from the N⁺ semiconductor substrate 11, it is not required to provide a GND pad to which the parasitic current flows into. Therefore, the increase of the chip area can be substantially restrained.

For example, the semiconductor device 1 (IPD) having such a high-side switch configuration is used for a car-mount application. The semiconductor device 1 (IPD) is mounted on the same ECU (Electronic Control Unit) substrate as a microcomputer and so on and is connected with the loads R such as lamps and solenoids installed in various sections of the car body through wire harnesses. As mentioned above, the electronic equipment is necessary and indispensable even in the car-mount application. However, electric noise generated from those electronic equipments and the natural phenomena, and unnecessary radio wave interfere with the other equipment to prevent the normal operation and a possibility to cause an erroneous operation is always regarded as being a problem. The standard of examination which evaluates endurance to the electric noise is prescribed in ISO7637 (for transient surge examination), and ISO10605 (for electrostatic examination) and so on. The semiconductor device 1 in the present embodiment can substantially restrain the parasitic current which is one of causes of the malfunction.

Figure 2A:
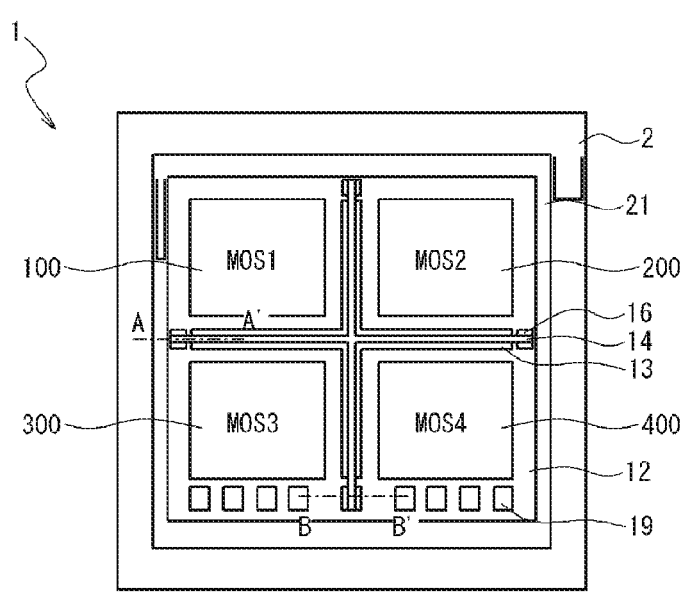
FIG. 2A are a plan view schematically showing a structure example of the semiconductor device according to the first embodiment.
Figure 2B:
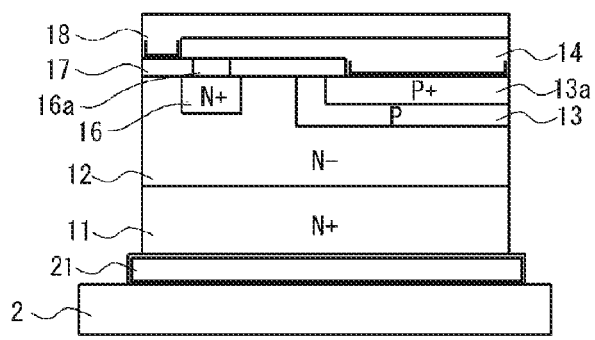
FIG. 2B is a sectional view schematically showing the section of the semiconductor device along a line A-A' in FIG. 2A.
Figure 2C:
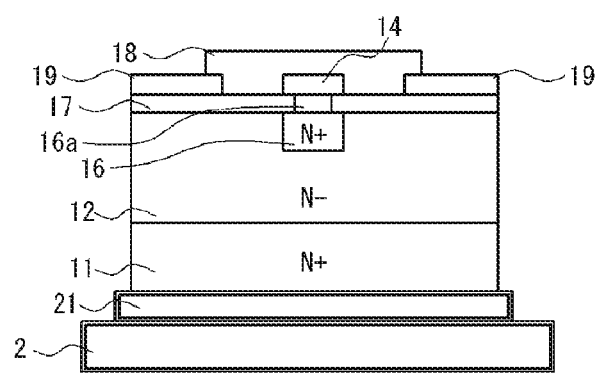
FIG. 2C is a sectional view schematically showing the section of the semiconductor device along a line B-B' in FIG. 2A.

FIG. 2A is a plan view schematically showing a structure example of the semiconductor device according to the present embodiment. FIG. 2A shows the semiconductor device 1 which has four output power MOSFETs (4-channel) as an example. In FIG. 2A, the interconnections of the output power MOSFETs 100 to 400 are omitted. Also, FIG. 2B and FIG. 2C are sectional views showing an A-A' section and a B-B' section in FIG. 2A, respectively. That is, FIG. 2B and FIG. 2C are sectional views of a portion where the P-type diffusion layer region 13 is connected with the N⁺ semiconductor substrate 11 having the battery voltage $V_{BAT}$ through the electrode layer 14.

The semiconductor device 1 is mounted on a lead frame 2 through solders 21. Specifically, the lower surface of the N⁺ semiconductor substrate 11 is electrically connected with a lead frame 2 with the battery voltage $V_{BAT}$ through solder 21. In an example of FIG. 2A, the semiconductor device 1 has four of the output power MOSFETs 100, 200, 300, and 400 (4-channel). The output power MOSFETs 300 and 400 are the same as the output power MOSFETs 100 and 200. The output power MOSFETs 100, 200, 300, and 400 are arranged in a matrix of 2 rows and 2 columns. The P-type diffusion layer region 13 is arranged in a cross manner to provide a boundary between adjacent two of the output power MOSFET 400, the output power MOSFET 300, the output power MOSFET 200 and the output power MOSFET 100. It is desirable that the ends of the P-type diffusion layer region 13 are the same as the ends of each of the output power MOSFETs or are extended to outer portions than the ends. Thus, the effect to prevent the parasitic current is improved. The pads 19 are provided in a section near the output power MOSFETs 300 and 400 to connect the output power MOSFETs 100, 200, 300, and 400 and external circuits.

The P-type diffusion layer region 13 is connected with the electrode layer 14 through the P-type diffusion layer region 13*a* of a high concentration formed in the surface region of the N⁻ epitaxial layer 12. The end of the P-type diffusion layer region 13*a* extends to the same position as the end of each output power MOSFET or a position outside the end of each MOSFET so as to be positioned on the position of the end of the P-type diffusion layer region 13. The end of the electrode layer 14 (e.g. aluminum layer) extends to a position outside the end of the P-type diffusion layer region 13 or the end of each output power MOSFET. The electrode layer 14 is connected with the N⁺ diffusion layer region 16 (second diffusion layer region) through the via 16*a* passing through the interlayer insulating layer 17. The N⁺ diffusion layer region 16 is formed in the surface region of the N⁻ epitaxial layer 12. Therefore, the electrode layer 14 is connected with the N⁺ semiconductor substrate 11 with the battery voltage $V_{BAT}$ through the via 16*a*, the N⁺ diffusion layer region 16, and the N⁻ epitaxial layer 12. A protection cover film 18 is provided on the electrode layer 14.

It is desirable that the P-type diffusion layer region 13 is formed simultaneously with the P-type base layers 101, 201, ... of the output power MOSFETs 100, 200, .... This is because an additional manufacturing process is unnecessary. In this case, the P-type diffusion layer region 13 has a depth as much as the P-type base layers 101, 201, .... Also, it is desirable that the P-type diffusion layer region 13a is formed simultaneously with the P⁺ diffusion layers 104, 204, ... provided between the N⁺ diffusion layers 103a, 203a, ... of the output power MOSFETs 100, 200, .... This is because an additional manufacturing process is unnecessary. In this case, the P-type diffusion layer region 13a has a depth as much as the P⁺ diffusion layers 104, 204, .... Also, it is desirable that the N⁺ diffusion layer region 16 is formed simultaneously with the N⁺ diffusion layers 103a, 203a, ... of the output power MOSFETs 100, 200, .... This is because an additional manufacturing process is unnecessary. In this case, the N⁺ diffusion layer region 16 has a depth as much as the N⁺ diffusion layer 103a, 203 a, .... Moreover, it is desirable that the electrode layer 14 is formed simultaneously with the electrodes 103, 203, .... This is because an additional manufacturing process is unnecessary.

In this semiconductor device 1, the P-type diffusion layer region 13 is connected with the N⁺ semiconductor substrate 11 having the battery voltage $V_{BAT}$ through the P-type diffusion layer region 13a, the electrode layer 14, the via 16a, the N⁺ diffusion layer region 16, and the N⁻ epitaxial layer 12. Thus, the parasitic current which flows into the P-type diffusion layer region 13 can be escaped to the N⁺ semiconductor substrate 11. At this time, it is enough that the N⁺ diffusion layer region 16 is provided above the N⁺ semiconductor substrate 11, and it is not required that the region 16 has the shape and size similar to those of the pad 19, and is arranged with the other pads 19 in a row. For example, if not influencing another device, the N⁺ diffusion layer region 16 may be formed in a suitable free space. In other words, it is not necessary to provide a pad such as the GND pad. Therefore, the increase of the chip area can be substantially restrained.

Note that when influence of electric noise is relatively low, only the P-type diffusion layer region 13a may be provided without the P-type diffusion layer region 13. This is because even in such a case, the P-type diffusion layer region 13a is nearer to the P-type base layer 201 than the P-type base layer 101. Also, there is not a special limitation with respect to the depth of the P-type diffusion layer regions 13 and 13a but the effect of reduction of the parasitic current is greater as the depth is deeper.

Figure 3A:
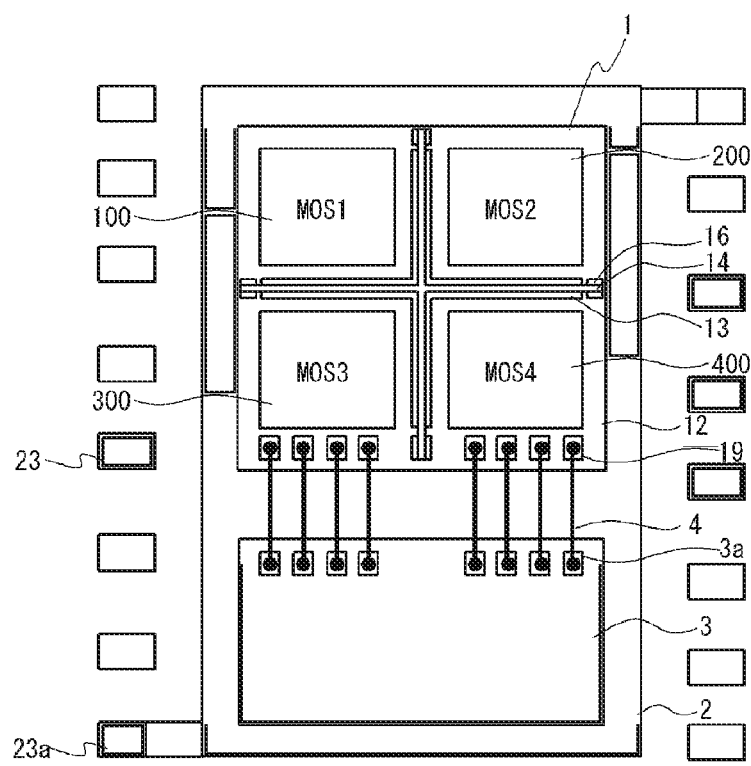
FIG. 3A is a plan view schematically showing an application example of the semiconductor device according to the first embodiment.

FIG. 3A is a plan view schematically showing an application example of the semiconductor device according to the present embodiment. FIG. 3A shows a multi-chip configuration in which the semiconductor device 1 is mounted on the lead frame 2 together with a control chip 3. The semiconductor device 1 has four output power MOSFETs (4-channel) shown in FIG. 2A. The output terminals OUT1 to OUT4 of the output power MOSFETs 100 to 400 of the semiconductor device 1 are connected with terminals 23, respectively. However, in FIG. 3A, the interconnections of the output power MOSFETs 100 to 400, the output terminals OUT1 to OUT4 and the lead lines which connect them and the terminals 23, of the semiconductor device 1 are omitted.

The lead frame 2 is connected with a terminal 23a which supplies the battery voltage $V_{BAT}$, of the terminals 23. The semiconductor device 1 is mounted on the lead frame 2 which has the battery voltage $V_{BAT}$. Specifically, the N⁺ semiconductor substrate 11 is electrically connected with the lead frame 2 which has the battery voltage $V_{BAT}$ through solder 21. On the other hand, a substrate contact (N⁺ diffusion layer region 16+via 16a) is provided in each of the (four) ends of the P-type diffusion layer region 13 to conduct the parasitic current collected in the P-type diffusion layer region 13 to the N⁺ semiconductor substrate 11 (having battery voltage $V_{BAT}$). Therefore, in this semiconductor device 1, it is easy to escape the parasitic current from the substrate contacts in those ends.

The control chip 3 is provided with a control circuit (not illustrated) to control the operation of the semiconductor device 1. The pads 19 of the semiconductor device 1 and pads 3a of the control chip 3 are connected with bonding wires 4. Also, the input/output terminals of the control chip 3 are connected with the terminals 23, respectively. However, in FIG. 3A, the input/output terminals of the control chip 3 and the lead lines which connect them and the terminals 23 are omitted.

Figure 3B:
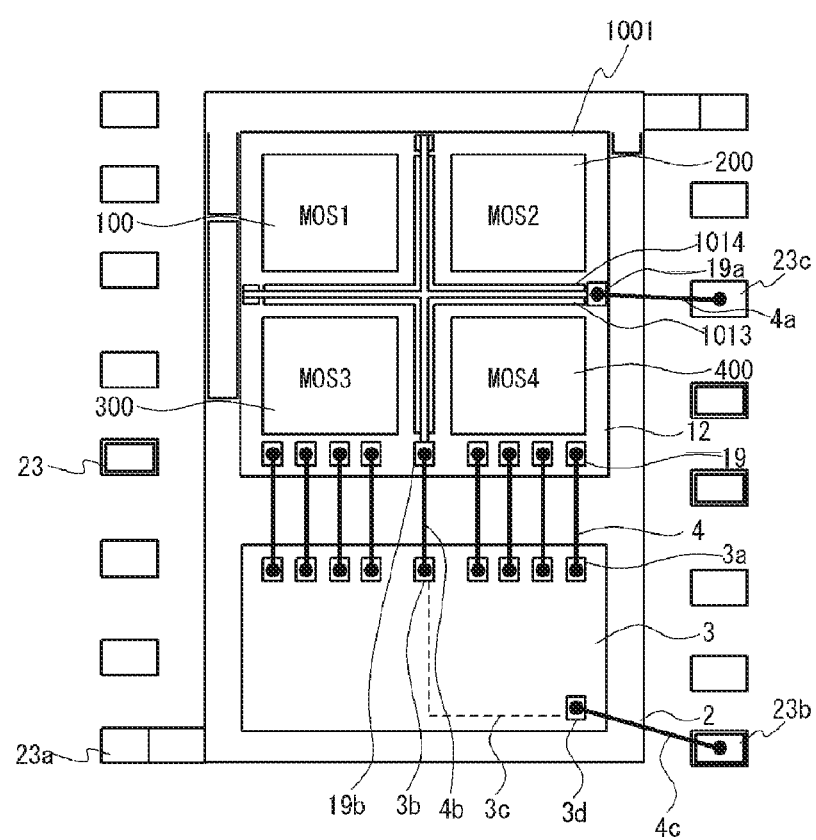
FIG. 3B is a plan view schematically showing an application example of the semiconductor device of a comparison example.

On the other hand, FIG. 3B is a plan view schematically showing an application example of the semiconductor device of a comparison example. A semiconductor device 1001 differs from the semiconductor device 1 (FIG. 3A) in the present embodiment in the point that a P-type diffusion layer 1013 and a trench oxide film 1014 are used as the P-type diffusion layer and a trench oxide film in Patent Literature 1, instead of the P-type diffusion layer region 13 of the present embodiment. That is, the P-type diffusion layer 1013 connected with the GND voltage is formed between the output power MOSFETs 100 to 400.

The P-type diffusion layer 1013 needs to be connected with the GND voltage. Therefore, a plurality of pads 19a and 19b need to be provided for the semiconductor device 1001 for bonding wires 4a and 4b connected with the GND voltage. This is because the interconnection resistance on the P-type diffusion layer 1013 is high. Also, because the interconnection resistance is relatively high even if an aluminum interconnection is formed on the P-type diffusion layer 1013, the plurality of pads 19a and 19b need to be provided in the same way. Also, it is necessary to provide a plurality of pads 3b and 3d for bonding wires 4b and 4c and the GND interconnection 3c in the control chip 3. Thus, it is necessary to allocate the terminal 23c of the terminals 23 in addition to the terminal 23b as the GND terminal. For example, at this time, the parasitic current needs to flow through the route of the P-type diffusion layer 1013—an aluminum interconnection—the pad 19a—the bonding wire 4a—the terminal 23c. For example, the parasitic current needs to flow through the route of the P-type diffusion layer 1013—the aluminum interconnection—the pad 19b—the bonding wire 4b—the pad 3b—the GND interconnection 3c—the pad 3d—the bonding wire 4c—the terminal 23b. At this time, when passing through the GND terminal 23c directly without passing though the control chip 3, it is necessary to allocate the GND terminal 23c of exclusive-use, resulting in the restriction of the number of pins. On the other hand, when passing through the GND terminal 23b through the control chip 3, it is difficult to make the parasitic current flow efficiently into the GND terminal 23b, because the resistance of the bonding wire 4b, the resistance of the GND interconnection 3c on the control chip 3 and the resistance of the bonding wire 4c are connected in series.

In this way, comparing the semiconductor device 1 (FIG. 3A) according to the present embodiment and the semiconductor device 1001 (FIG. 3B) of the comparison example, the GND terminal 23c of the exclusive use needs not to be allocated and the restriction of the number of pins is not present in the semiconductor device 1 according to the present embodiment. Also, in the semiconductor device 1, it is not necessary to provide the pads 19a and 19b, it is enough to provide the substrate contact (N⁺ diffusion layer region 16+via 16a), the area of which is smaller than the area of the pads 19a and 19b. Therefore, the increase of the chip area can be restrained by an area difference. Also, in the semiconductor device 1, the parasitic current can be made to flow into the battery voltage $V_{BAT}$ through the substrate contact without receiving influence of the resistances of the bonding wire 4b, the GND interconnection 3c and the bonding wire 4c, resulting in very high efficiency.

Moreover, the substrate contact to the N⁺ semiconductor substrate 11 can be arranged in an optional location above the N⁺ semiconductor substrate 11 in the semiconductor device 1 in addition to an example of FIG. 3A. Thus, the P-type diffusion layer region 13 can be connected with the battery voltage $V_{BAT}$ through the substrate contact provided in a nearer location. As a result, it is made possible for the parasitic current to flow into the battery voltage $V_{BAT}$ more efficiently.

In this case, in the configuration of the semiconductor device 1 as shown in FIG. 2A, the current amplification rate $h_{FE}$ the parasitic PNP transistor 15 was compared through a simulation between a case of existence of the P-type diffusion layer region 13 and a case of non-existence of it. Then, the following result was obtained. However, it is supposed that the voltage $V_{BAT}+\alpha$ is applied to the source of the output power MOSFET 200, the GND voltage is applied to the source of the output power MOSFET 100, and the battery voltage $V_{BAT}$ is applied to the P-type diffusion layer region 13 and the N⁺ semiconductor substrate 11. Also, it is supposed that the current supplied from the N⁺ semiconductor substrate 11 is $I_B$ and the current supplied from the source of the output power MOSFET 100 is $I_C$. In this case, $h_{FE}$ ($=I_C/I_B$) when the P-type diffusion layer region 13 exists is smaller for 2 digits than $h_{FE}$ when the P-type diffusion layer region 13 does not exist. That is, the parasitic current which flows through the source of the output power MOSFET 100 is smaller for 2 digits in the case that the P-type diffusion layer region 13 exists than the case that the P-type diffusion layer region 13 does not exist. In this way, the semiconductor device 1 of the present embodiment can lead the parasitic current to the battery voltage $V_{BAT}$ appropriately and can reduce the parasitic current to the source of the output power MOSFET 100.

Figure 4:
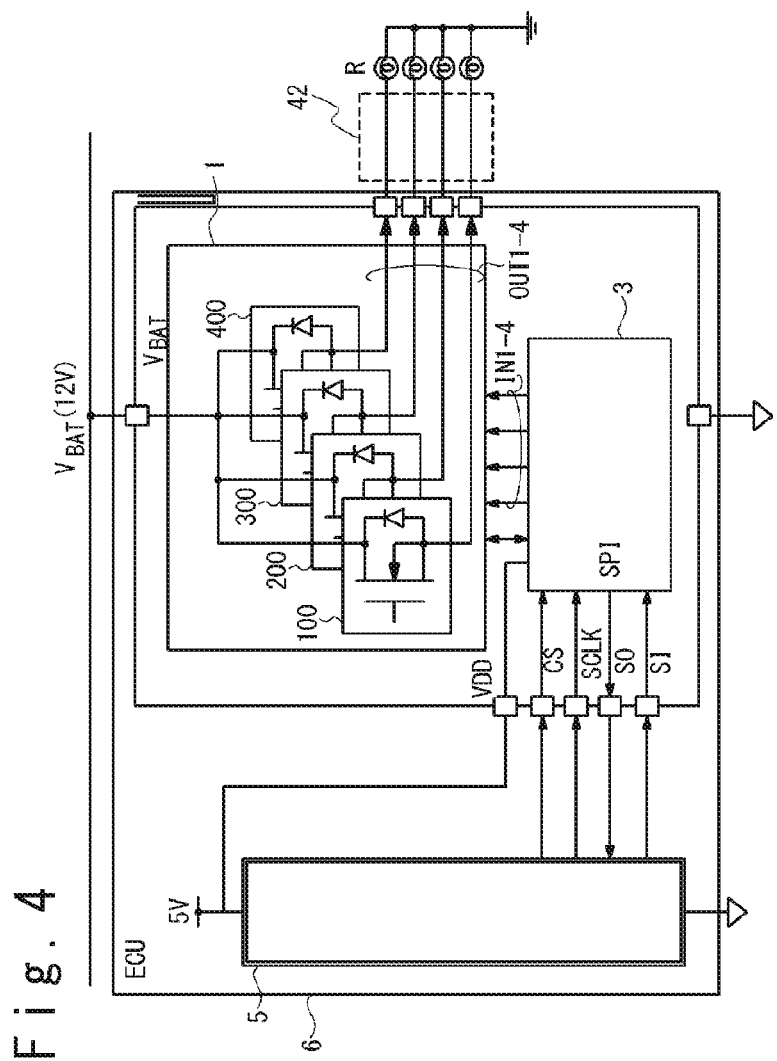
FIG. 4 is a circuit block diagram showing a system when the semiconductor device according to the first embodiment is applied to a 4-output high-side IPD.

FIG. 4 is a circuit block diagram showing a system when the semiconductor device 1 according to the present embodiment is applied to the 4 output high-side IPD. Here, an example is shown in which the multi-chip configuration (semiconductor device 1+control chip 3) shown in FIG. 3A is applied to the car-mounted 4-output high-side IPD. This car-mount IPD has a microcomputer 5 mounted on an ECU (Engine Control Unit) substrate 6 and the semiconductor device 1 and the control chip 3 of the multi-chip configuration. The microcomputer 5 controls the operation of the semiconductor device 1 by a control signal through the control chip 3 based on a program and an external signal (containing a signal from the control chip 3). The control signal is exemplified as CS (Chip Selection), SCLK (Serial Clock), SO (Serial Output), and SI (Serial Input). The control chip 3 controls the operation of the semiconductor device 1 by the control signal based on a control signal from microcomputer 5 and a detection signal (e.g. over-current, over-heat, broken) from the semiconductor device 1. The semiconductor device 1 controls the turn on/off of the output power MOSFETs 100 to 400 of 4 channels of the semiconductor device 1 based on the control signal from the control chip 3. Also, the semiconductor device 1 detects an over-current, an over-heat, and a broken line and so on and notifies the detected result to the control chip 3. The input terminal of the output power MOSFETs 100 to 400 is connected with the battery voltage $V_{BAT}$ and the output terminals OUT1 to OUT4 thereof are connected with the loads R which are arranged in the sections of the vehicle through a wire harness 42. However, the loads are exemplified by a headlight, a flasher, and a tail lamp.

In this case, there is a fear that induction noise and surge voltage are applied from a wire harness 42 and are applied to the output terminals of the output power MOSFETs. However, the semiconductor device 1 of the present embodiment can prevent the parasitic current from flowing into the load R from the output terminal (source) of the other output power MOSFET, even if such electric noise is applied to the output terminal (source) of the output power MOSFET, as described in the following operation.

Next, the operation of the semiconductor device 1 according to the present embodiment will be described.

However, the operation when the semiconductor device 1 shown in FIG. 1B is applied to the car-mounted 4-output high-side IPD shown in FIG. 4 will be described. In this case, the operation when electric noise is applied to the output terminal of the output power MOSFET will be described.

First, it is supposed that electric noise (voltage $V_{BAT}+\alpha$) is applied from the wire harness 42 to the source electrode 203 (connected with the output terminal OUT2) of the output power MOSFET 200 in FIG. 1B and FIG. 4. The N⁺ semiconductor substrate 11 and the N⁻ epitaxial layer 12 are connected with the battery voltage $V_{BAT}$. However, when the electric noise which has a voltage higher than the battery voltage $V_{BAT}$ is applied to the output terminal OUT2, the P-type base layer 201 is biased in a forward direction so that the base current $I_B$ flows into the base (N⁻ epitaxial layer 12, N⁺ semiconductor substrate 11) of the parasitic PNP transistor 15. In addition, the collector current $I_C$ flows into the P-type diffusion layer region 13 connected with the battery voltage $V_{BAT}$. That is, because the P-type diffusion layer region 13 is nearer the P-type base layer 201 than the P-type base layer 101 of the output power MOSFET 100, the collector current $I_C$ (the parasitic current) never flows into the output power MOSFET 100.

When the P-type diffusion layer region 13 does not exist, the base current $I_B$ flows into the base of the parasitic PNP transistor 15 due to the electric noise from the output terminal OUT2 of the output power MOSFET 200, and the collector current $I_C$ (parasitic current) flows into the P-type base layer 101 (source) of the output power MOSFET 100. In this case, when the output power MOSFET 100 in the off state, the current (parasitic current) which should not flow originally flows through the load R connected with the output terminal OUT1. For example, when the load R is a lamp, there is a fear to cause a malfunction to light up when it should be lit off. On the other hand, there is a fear that the excess current (parasitic current) flows through the load R connected with the output terminal OUT1 so that the current which exceeds the rating of the load R flows, when the output power MOSFET 100 is in the on state. For example, when the load R is a lamp, there is a fear that a filament is burnout. However, in the semiconductor device 1 according to the present embodiment, because it is possible to substantially restrain that the P-type diffusion layer region 13 exists so that the parasitic current flows to the output terminal OUT1 of the N-channel power MOSFET 100, the malfunction which happens in the load R can be prevented.

Therefore, the semiconductor device 1 of the present embodiment can attain the following effects. When electric noise is applied to the source electrode 203 of the output power MOSFET 200, the parasitic current flows into not the P-type base layer 101 of the output power MOSFET 100 but the P-type diffusion layer region 13 connected with the battery voltage $V_{BAT}$ which is nearer than the P-type base layer 101. Therefore, the parasitic current never flows into the output power MOSFET 100. As a result, when the output power MOSFET 100 is in the off state, a malfunction of the load R (e.g. erroneous light of a lamp) can be prevented. In addition, when the output power MOSFET 100 is in the on state, a damage of the load R due to the over-current (e.g. current above the rating flows into the lamp so that the filament is burnout) can be prevented. At this time, the P-type diffusion layer region 13 is connected with the battery voltage $V_{BAT}$ (e.g. $N^+$ semiconductor substrate 11 through $N^-$ epitaxial layer 12) as a flow destination of the parasitic current. Therefore, the increase of the chip area can be substantially restrained because it is not necessary to provide a GND pad and it is enough to provide the P-type diffusion layer region 13 with a narrow width.

Second Embodiment

The semiconductor device according to a second embodiment will be described. The second embodiment is different from the first embodiment in points that a P-type well is provided around the output power MOSFETs and the P-type diffusion layer region is provided between the output power MOSFETs. Below, the differences will be described mainly.

Figure 5:
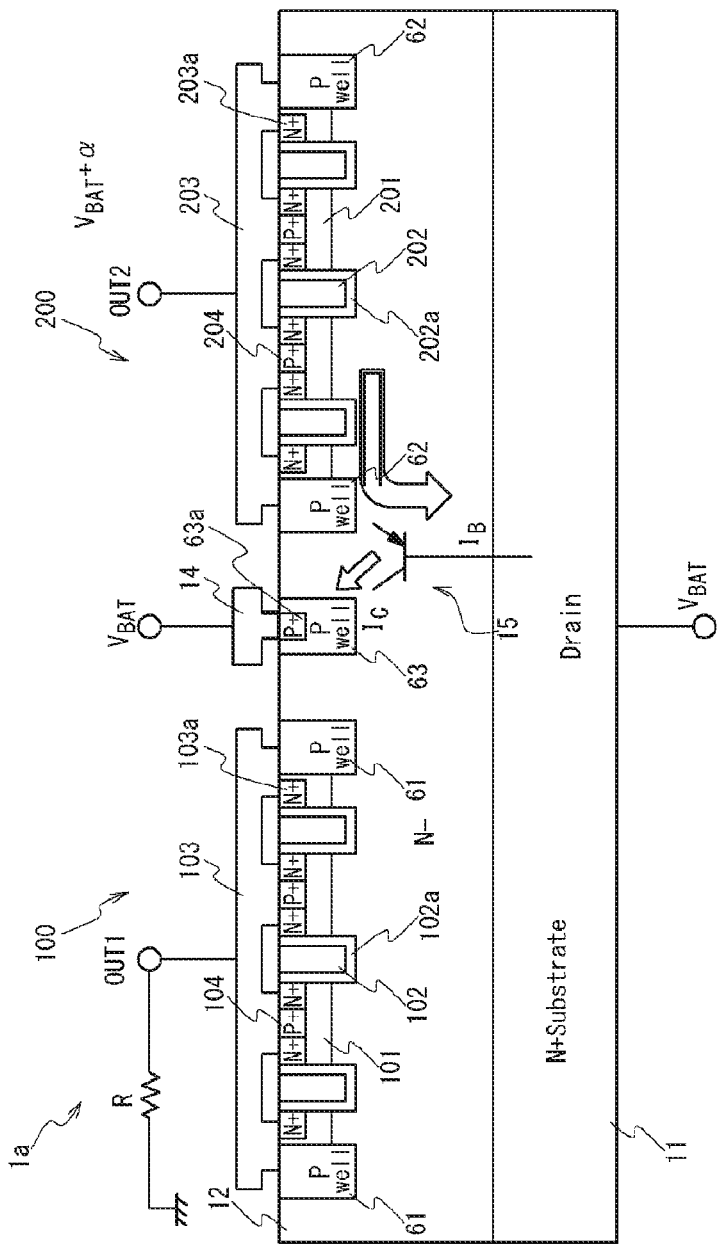
FIG. 5 is a sectional view schematically showing a structure example of the semiconductor device according to a second embodiment.

A structure example of the semiconductor device according to the second embodiment will be described. FIG. 5 is a sectional view schematically showing the structure example of the semiconductor device according to the second embodiment. Moreover, the semiconductor device 1a of the present embodiment has a P-type well 61 formed around the P-type base layer 101 of the output power MOSFET 100 and a P-type well 62 formed around the P-type base layer 201 of the output power MOSFET 200. The P-type wells 61 and 62 are formed in an outer circumference of the P-type base layers 101 and 201 in a ring, and are the P-type wells which are deeper than the P-type base layers 101 and 201. Thus, it is possible to relatively increase the breakdown voltage of the output power MOSFETs 100 and 200.

Moreover, the semiconductor device 1a has a P-type diffusion layer region 63 and a P-type diffusion layer region 63a instead of the P-type diffusion layer region 13 and the P-type diffusion layer region 13a. The P-type diffusion layer region 63 is formed to provide a boundary between the output power MOSFET 100 and the output power MOSFET 200 in the surface region of the $N^-$ epitaxial layer 12. The P-type diffusion layer region 63a is of a high concentration rather than the P-type diffusion layer region 63, and is provided in the surface region of the $N^-$ epitaxial layer 12 to connect the P-type diffusion layer region 63 with the electrode layer 14. The electrode layer 14 is connected with the battery voltage $V_{BAT}$.

However, when there are three or more output power MOSFETs, the P-type diffusion layer region 63 is formed to provide the boundary between the two neighboring output power MOSFETs. Note that the shape and arrangement of the P-type diffusion layer region 63 and the P-type diffusion layer region 63a are the same as those of the P-type diffusion layer region 13 and the P-type diffusion layer region 13a in the first embodiment except for the depth of the P-type diffusion layer region 63.

Here, it is desirable that the P-type diffusion layer region 63 is formed at a same time as the P-type wells 61 and 62 of the output power MOSFETs 100 and 200. This is because an additional manufacturing process is unnecessary. In this case, the P-type diffusion layer region 63 has a depth as much as those of the P-type wells 61 and 62. In this way, because it is possible to widen the area of the collector region of the parasitic PNP transistor 15 by making the depth of the P-type diffusion layer region 63 deeper than the depth of the P-type diffusion layer region 13, the parasitic current can flow into the electrode layer 14 with the battery voltage $V_{BAT}$ more efficiently.

Note that when the influence of the electric noise is relatively low, the P-type diffusion layer region 63 may be omitted and only the P-type diffusion layer region 63a may be provided. Also, there is not an especial limitation to the depth of the (63, 63a) but the deeper P-type diffusion layer region makes the parasitic current to be reduced more.

The same effect as the first embodiment can be attained in the present embodiment.

In addition, it is possible to make the parasitic current flow into the electrode with the battery voltage $V_{BAT}$ more efficiently. Therefore, the parasitic current which flows into the output power MOSFET can be more reduced.

Third Embodiment

The semiconductor device according to a third embodiment will be described. In the third embodiment, the structure of the P-type diffusion layer region which is provided between the output power MOSFETs differs with that of the first embodiment. Below, the difference will be described mainly.

Figure 6:
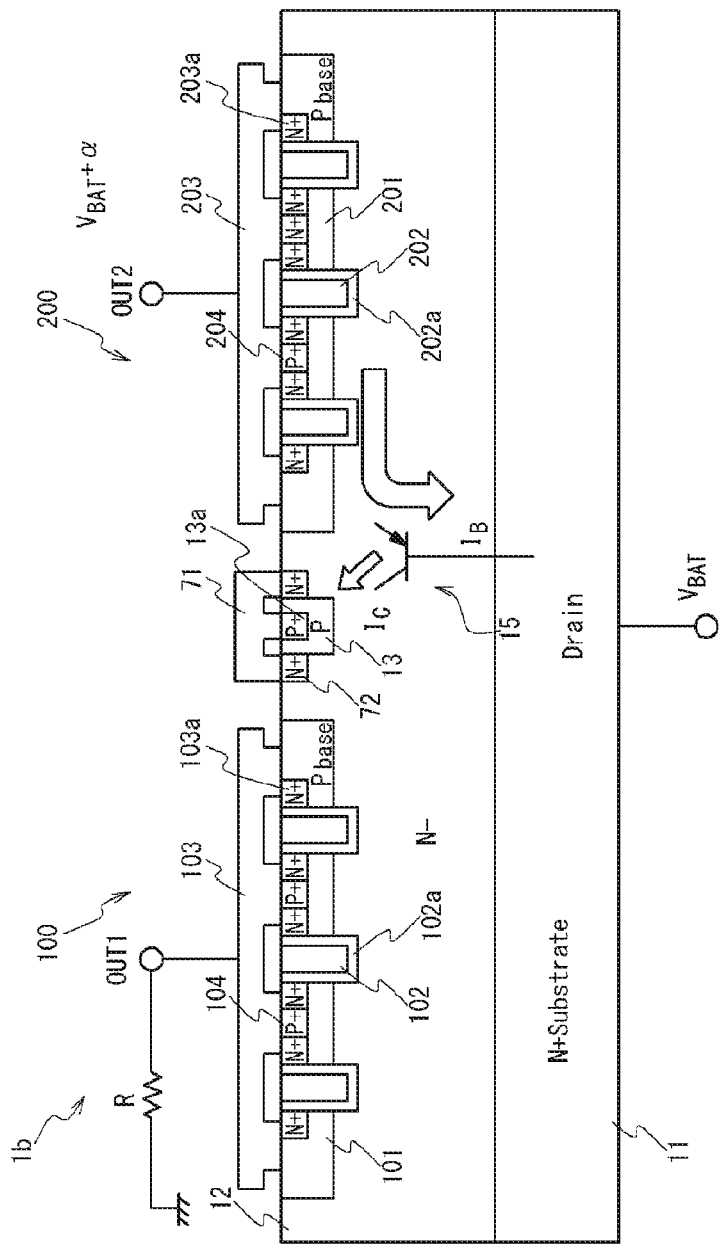
FIG. 6 is a sectional view schematically showing a structure example of the semiconductor device according to a third embodiment.

The structure example of the semiconductor device according to the third embodiment will be described. FIG. 6 is a sectional view schematically showing a structure example of the semiconductor device according to the third embodiment. Moreover, the semiconductor device 1b has an N-type diffusion layer region 72 and an electrode layer 71 instead of the electrode layer 14. The N-type diffusion layer region 72 is an N-type semiconductor layer with a high concentration formed in the surface region of the $N^-$ epitaxial layer 12. The N-type diffusion layer region 72 is provided on both sides of the P-type diffusion layer region 13 along the P-type diffusion layer region 13. In other words, the N-type diffusion layer region 72 is formed on both sides of the P-type diffusion layer region 13 to provide a boundary between the neighboring output power MOSFETs. The electrode layer 71 is formed along the P-type diffusion layer region 13 (13a) and the N-type diffusion layer region 72 on the P-type diffusion layer region 13 (13a) and N-type diffusion layer region 72. The P-type diffusion layer region 13 and the N-type diffusion layer region 72 are electrically connected through the P-type diffusion layer region 13a and the electrode layer 71.

At this time, the parasitic current which flows into the P-type diffusion layer region 13 is supplied through the P-type diffusion layer region 13a and the electrode layer 71 to the N-type diffusion layer region 72 on the opposite side to a side where the parasitic current is generated. Then, the parasitic current flows into the $N^+$ semiconductor substrate 11 with the battery voltage $V_{BAT}$ from the N-type diffusion layer region 72 through the $N^-$ epitaxial layer 12. Therefore, the parasitic current which flows into the P-type diffusion layer region 13 can reach the N⁺ semiconductor substrate 11 through the N⁻ epitaxial layer 12 from the N-type diffusion layer region 72 in the neighborhood to the region 13 without passing through the via 16a and the N⁺ diffusion layer region 16 shown in FIG. 2A and FIG. 2B. That is, the via 16a and the N⁺ diffusion layer region 16 shown in FIG. 2A and FIG. 2B become unnecessary.

However, when there are three or more output power MOSFETs, the N-type diffusion layer region 72 is formed to provide a boundary between the neighboring output power MOSFETs. Note that the shape and arrangement of the N-type diffusion layer region 72 are the same as those of the P-type diffusion layer region 13a except that the region 72 is arranged on both sides of the P-type diffusion layer region 13. Also, the shape and arrangement of the electrode layer 71 are the same as those of the electrode layer 14 except that the layer 71 is connected with the N-type diffusion layer region 72.

Here, it is desirable that the N-type diffusion layer region 72 is formed at the same time as those of the N⁺ diffusion layers 103a and 203a of the output power MOSFETs 100 and 200. This is because an additional manufacturing process is unnecessary. In this case, the N-type diffusion layer region 72 has a depth as much as those of the N⁺ diffusion layers 103a and 203a. Moreover, it is desirable that the electrode layer 71 is formed at the same time as the electrodes 103 and 203. This is because an additional manufacturing process is unnecessary.

The same effect as in the first embodiment can be attained in the present embodiment.

In addition, because the electrode layer 71 is connected with the battery voltage $V_{BAT}$ through the N-type diffusion layer region 72 in the neighborhood to the P-type diffusion layer region 13, the influence of a voltage drop due to the resistance of the electrode layer 71 (e.g. aluminum interconnection) is reduced. Therefore, the parasitic current which flows into the output power MOSFET can be more efficiently flowed into the battery voltage $V_{BAT}$.

Fourth Embodiment

The semiconductor device according to a fourth embodiment will be described. The present embodiment is different from the first embodiment in the point that the P-type diffusion layer region is provided between the output power MOSFET and a usual MOSFET. Below, the difference will be mainly described.

Figure 7:
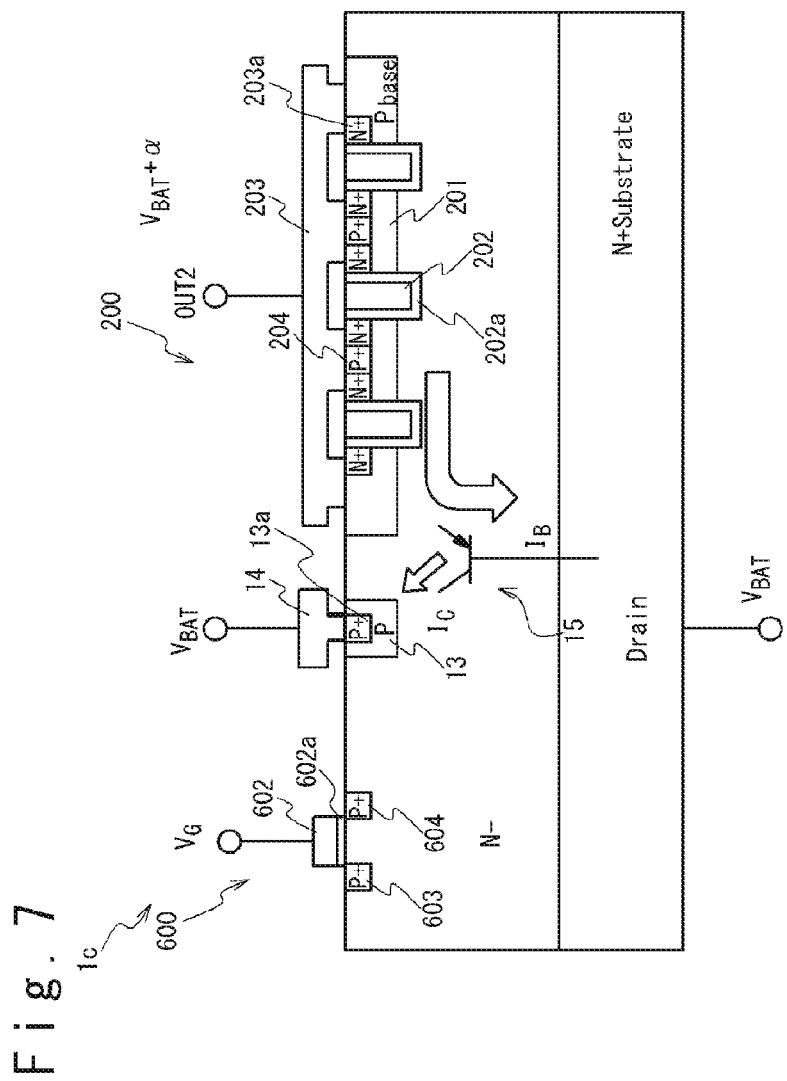
FIG. 7 is a sectional view schematically showing a structure example of the semiconductor device according to a fourth embodiment.
Figure 8:
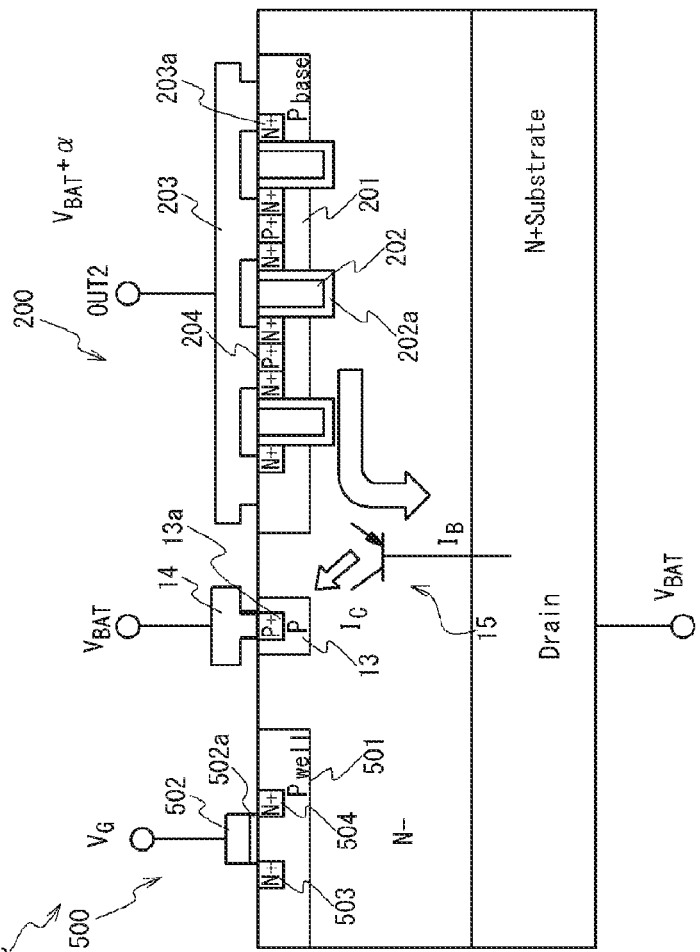
FIG. 8 is a sectional view schematically showing a structure example of the semiconductor device according to the fourth embodiment.

A structure example of the semiconductor device according to the fourth embodiment will be described. FIG. 7 and FIG. 8 are sectional views schematically showing the structure example of the semiconductor device according to the fourth embodiment. The semiconductor device 1c has a P-channel MOSFET 600 (FIG. 7) and an N-channel MOSFET 700 (FIG. 8) in addition to the output power MOSFET 200.

With reference to FIG. 7, the P-channel MOSFET 600 is a usual planar type P-channel MOS transistor formed in the surface region of the N⁻ epitaxial layer 12, and is used for the logic circuit. The source/drain (P⁺ diffusion layer) 603 and 604 of the P-channel MOSFET 600 are provided in the surface region of the N⁻ epitaxial layer 12. The gate insulating film 602a and the gate electrode 602 of the P-channel MOSFET 600 are provided on the channel region between the source/drain 603 and 604. Moreover, at this time, the P-type diffusion layer region 13 is formed to provide a boundary between the output power MOSFET 200 and the P-channel MOSFET 600 in the surface region of the N⁻ epitaxial layer 12.

Here, it is considered that electric noise is applied to the output terminal OUT2 of the output power MOSFET 200 in the semiconductor device 1c so that the voltage of the output terminal becomes $V_{BAT}+\alpha$. The N⁺ semiconductor substrate 11 and the N⁻ epitaxial layer 12 are connected with the battery voltage $V_{BAT}$, but when the voltage $V_{BAT}+\alpha$ higher than the battery voltage $V_{BAT}$ is applied to output terminal OUT2 as the electric noise, the P-type base layer 201 is biased in a forward direction. Therefore, as shown in FIG. 7, a phenomenon occurs as if the parasitic PNP transistor 15 (emitter: P-type base layer 201, base: epitaxial layer 12 and N⁺ semiconductor substrate 11, collector: source, drain 604 (P⁺ diffusion layer)/P-type diffusion layer region 13) exists just as it is. That is, the parasitic current from the P-type base layer 201 as an emitter flows into the N⁺ semiconductor substrate 11 and the epitaxial layer 12 as a base and the current also flows into the source/drain 604/P-type diffusion layer region 13 as a collector. At this time, in the semiconductor device 1c of the present embodiment, the P-type diffusion layer region 13 exists in front of (in the neighborhood to) the source/drain 604 with respect to the P-type base layer 201. Therefore, the parasitic current flows into the P-type diffusion layer region 13 not the source/drain 604. Therefore, it is possible to restrain that the parasitic current flows into the P-channel MOSFET 600. That is, because the parasitic current can be reduced, the power consumption can be reduced.

Also, with reference to FIG. 8, the N-channel MOSFET 500 is a usual planar type N-channel MOS transistor formed in the P well 501 which is formed in the surface region of the N⁻ epitaxial layer 12 and is used for a logic circuit. The source/drain of (N⁺ diffusion layer) 503 and 504 of the N-channel MOSFET 500 are formed in the P well 501 formed in the surface region of the N⁻ epitaxial layer 12. A gate insulating film 502a and a gate electrode 502 of the N-channel MOSFET 500 are provided on the channel region between the source/drain 503 and 504. Moreover, at this time, the P-type diffusion layer region 13 is formed to provide a boundary between the output power MOSFET 200 and the N-channel MOSFET 500 in the surface region of the N⁻ epitaxial layer 12.

Here, in the semiconductor device 1c, it is considered that electric noise is applied to the output terminal OUT2 of the output power MOSFET 200 so that the voltage of the output terminal becomes $V_{BAT}+\alpha$. The N⁺ semiconductor substrate 11 and the N⁻ epitaxial layer 12 are connected with the battery voltage $V_{BAT}$, but when the voltage $V_{BAT}+\alpha$ higher than the battery voltage is applied to the output terminal OUT2 as the electric noise, the P-type base layer 201 is biased in the forward direction. Therefore, as shown in FIG. 8, a phenomenon occurs as if the parasitic PNP transistor 15 (emitter: P-type base layer 201; base: epitaxial layer 12 and N⁺ semiconductor substrate 11; collector: P well 501/P-type diffusion layer region 13) exists. That is, the parasitic current from the P-type base layer 201 as an emitter flows into the N⁺ semiconductor substrate 11 and the epitaxial layer 12 as a base and the current also flows into the P well 501/the P-type diffusion layer region 13 as a collector. At this time, in the semiconductor device 1c of the present embodiment, the P-type diffusion layer region 13 exists in front of (in the neighborhood to) the P well 501 with respect to the P-type base layer 201. Therefore, the parasitic current flows into not the P well 501 but the P-type diffusion layer region 13. Therefore, it is possible to restrain that the parasitic current flows into the N-channel MOSFET 500. That is, because the parasitic current can be reduced, the power consumption can be reduced.

Figure 9:
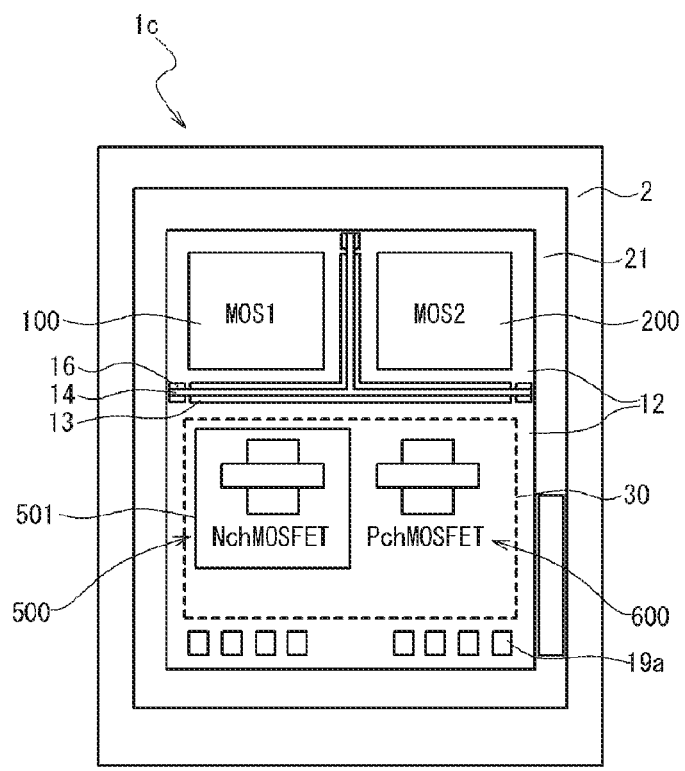
FIG. 9 is a plan view schematically showing a structure example of the semiconductor device according to the fourth embodiment.

FIG. 9 is a plan view schematically showing a structure example of the semiconductor device according to the present embodiment. FIG. 9 shows two output power MOSFETs (2-channel) and the semiconductor device 1c having the control circuit 30 as an example. In FIG. 9, the interconnections with respect to the output power MOSFETs 100 to 200 are omitted. Also, the control circuit 30 has a plurality of P-channel MOSFETs 600 and a plurality of N-channel MOSFETs 500. In FIG. 9, the P-channel MOSFET 600 and the N-channel MOSFET 500 are exemplified as the control circuit 30 and the related interconnections are omitted.

The semiconductor device 1c is mounted on the lead frame 2 through the solder 21. Specifically, the lower surface of the N+ semiconductor substrate 11 is electrically connected with the lead frame 2 having the battery voltage $V_{BAT}$ through the solder 21. In an example of FIG. 9, the semiconductor device 1c has the two output power MOSFETs 100 and 200 (2-channel), and the control circuit 30 (a plurality of P-channel MOSFETs 600 and a plurality of N-channel MOSFETs 500). For example, the control circuit 30 contains circuits such as a charge pump circuit, a temperature detecting circuit and a current detecting circuit. The P-type diffusion layer region 13 is arranged in a T-like shape to provide a boundary between the output power MOSFET 200, the output power MOSFET 100 and the control circuit 30 (P-channel MOSFET 600 and N-channel MOSFET 500). It is desirable that the end of the P-type diffusion layer region 13 extends to the end of each output power MOSFET or an outer end than the end. Thus, the effect of preventing the parasitic current is improved more. The output power MOSFETs 100 and 200 and the pads 19 which connect the control circuit 30 and an external circuit are provided for the side of the control circuit 30.

In the semiconductor device 1c, as in the cases of FIG. 2B and FIG. 2C, the P-type diffusion layer region 13 is connected with the N+ semiconductor substrate 11 having the battery voltage $V_{BAT}$ through the P-type diffusion layer region 13a, the electrode layer 14, the via 16a, the N+ diffusion layer region 16, and the N− epitaxial layer 12. Thus, the parasitic current which flows into the P-type diffusion layer region 13 can be reduced from the N+ semiconductor substrate 11.

Therefore, the inflow of the parasitic current from one of the output power MOSFET 100 and the output power MOSFET 200 to the other can be prevented by the P-type diffusion layer region 13 and the inflow of the parasitic current from the output power MOSFET 100 and the output power MOSFET 200 to the control circuit 30 can be prevented. That is, it becomes possible to reduce the parasitic current which flows into the source/drain of the P-channel MOSFET 600 from the output power MOSFET 100 and the output power MOSFET 200 and to reduce the parasitic current which flows into the P well 501 (back gate) of the N-channel MOSFET 500.

In this case, the same effect as the first embodiment can be attained.

In addition, it is possible to prevent the parasitic current from flowing into the P-channel MOSFET 600 and the N-channel MOSFET 500 of the control circuit 30 and to prevent a malfunction of the control circuit 30.

Figure 10:
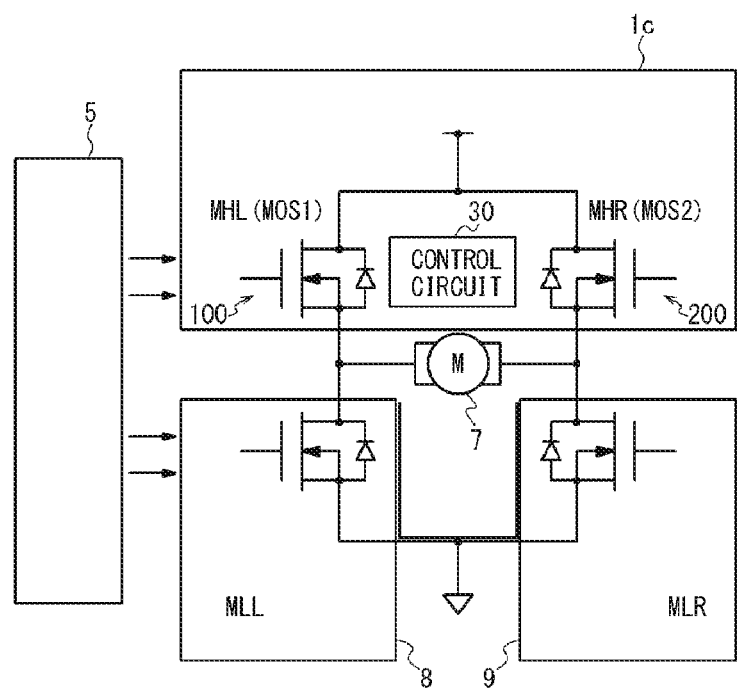
FIG. 10 is a circuit block diagram showing a system when the semiconductor device according to the fourth embodiment is applied to a 2-output high-side IPD.

FIG. 10 is a circuit block diagram showing a system when the semiconductor device according to the fourth embodiment is applied to a 2-output high-side IPD. FIG. 10 is an example of the circuit diagram when an H bridge is configured by applying the semiconductor device 1c of FIG. 9 to the 2-output high-side IPD. The H bridge includes the semiconductor device (2-output high-side IPD) controlled by the microcomputer 5, a motor 7, a transistor MLL 8 and the transistor MRL 9.

The drains of the output power MOSFET 100 (transistor MHL) and the output power MOSFET 200 (transistor MHR) in the semiconductor device 1c are connected with the higher voltage side power supply (e.g. $V_{BAT}$). The source of the output power MOSFET 100 (MHL) is connected with one of the terminals of the motor 7 and the drain of the transistor MLL 8 (the power MOSFET) on a low-side. The source of the output power MOSFET 200 (MHR) is connected with the other terminal of the motor 7 and the drain of the transistor MLR 9 (power MOSFET) on the low-side. The sources of the transistor MLL 8 and the transistor MLR 9 are connected with the lower voltage side power supply (e.g. the GND).

For example, when the output power MOSFET 100 (MHL) and the transistor MLR 9 are in the on state, the current flows from the higher voltage side power supply to the lower voltage side power supply through the output power MOSFET 100 (MHL), the motor 7 and the transistor MLR 9, and the motor 7 rotates. Here, when the transistor MLR is turned off, the forward current flows through a body diode of the output power MOSFET 200 (MHR) during regeneration. However, the forward current is a current in a direction toward the drain from the source of the output power MOSFET 200 (MHR). That is, the current is supplied to the output terminal of the output power MOSFET 200 (MHR) from the outside. As a result, there is a possibility that the output power MOSFET 100 (MHL) and the control circuit 30 are influenced. For example, regarding the output power MOSFET 100 (MHL), there is a possibility that a deviation in sense ratio and so on is generated. Also, regarding the control circuit 30, there is a possibility that the N-channel MOSFET 500 and the P-channel MOSFET 600 do not turn on or do not turn off, and the current detection value is deviated and the overheating detection value is deviated. However, because the semiconductor device 1c according to the present embodiment has the P-type diffusion layer region 13, the influence of the parasitic current from the source of the output power MOSFET 200 (MHR) can be substantially restrained. Thus, it is possible to prevent the output power MOSFET 100 (MHL) and the control circuit 30 from undergoing the influence.

Figure 11:
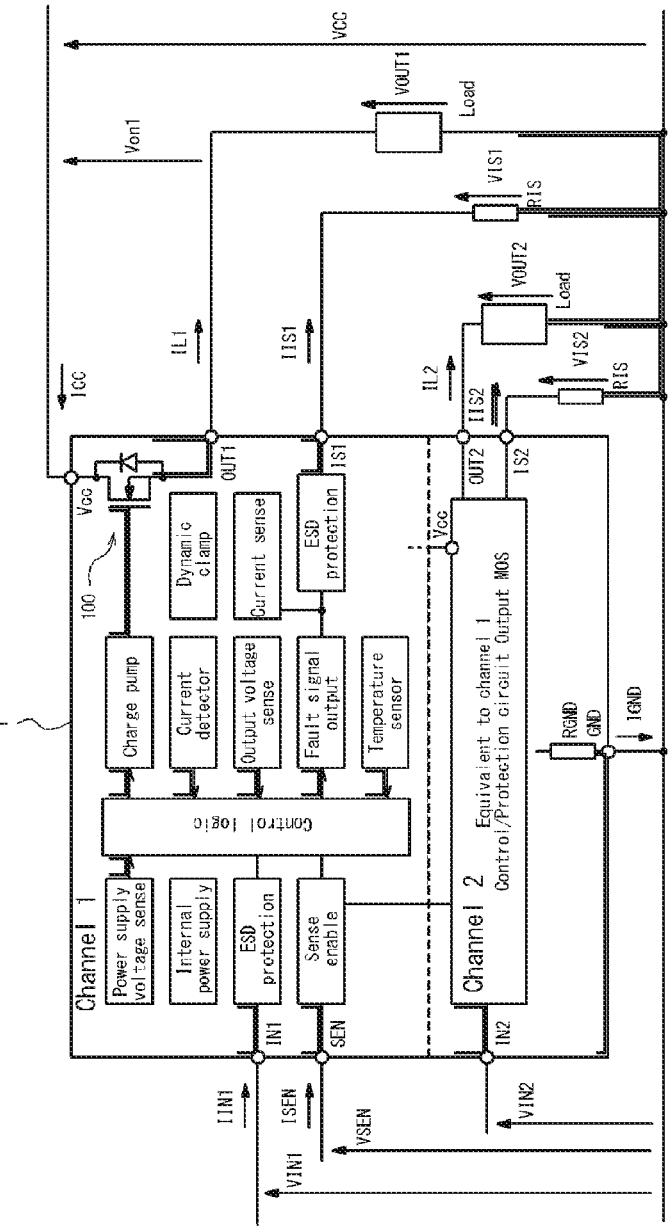
FIG. 11 is a circuit block diagram showing a system when the semiconductor device according to the fourth embodiment is applied to the 2-output high-side IPD.

FIG. 11 is a circuit block diagram showing a system when the semiconductor device according to the fourth embodiment is applied to the 2-output high-side IPD. The semiconductor device 1 in FIG. 11 is the semiconductor device 1c of FIG. 9. Although the Channel_2 is not shown in detail, it is the same as the Channel_1. The Channel_1 has the output power MOSFET 100 and the Channel_2 has the output power MOSFET 200 (not shown). The other structure of Channel_1 is equivalent to the control circuit 30. The control circuit 30 has a power supply voltage sense circuit, an internal power supply circuit, an ESD protection circuit, a sense enable circuit, and a control logic circuit. Moreover, the control circuit 30 has a charge pump circuit, a current detector circuit, an output voltage sense circuit, a fault signal circuit, a temperature sensor circuit, a dynamic clamp circuit, a current sense circuit. The Channel2 is same as the Channel1. VCC is the higher voltage side power supply voltage and the GND is the lower voltage side power supply voltage.

For example, the power supply voltage sense circuit measures a power supply voltage. The internal power supply circuit supplies a desired power supply voltage to the inside of the circuit. The ESD protection circuit protects the circuit from an ESD. The sense enable circuit makes detection possible. The charge pump circuit generates a gate voltage of the output power MOSFET. The current detector circuit detects an over-current. The Output voltage sense circuit measures output voltage. The fault signal circuit outputs an extraordinary detection signal. The temperature sensor circuit measures a temperature. The dynamic clamp circuit clamps a surge voltage generated when an inductive load is blocked off in current. The current sense circuit measures a current. The control logic circuit controls the operation of the Channel1 based on a signal from each circuit. The semiconductor device 1 has protection functions such as the current limitation function, the overheating detection function, and the broken interconnection detection function by these circuits and communicates a self-diagnosis result to the microcomputer on the side of the control.

Also, supposing that the semiconductor device 1 is applied to the configuration shown in FIG. 10, the load of VOUT1 corresponds to the motor 7 (on the side of one end) and the transistor MLL 8 and the load of VOUT2 corresponds to the motor 7 (on the side of the other end) and the transistor MLR 9.

As described above, in the semiconductor device of each embodiment, it is not necessary to provide the GND pad of the output power MOSFET by connecting the P-type diffusion layer regions 13 and 63 with the battery voltage $V_{BAT}$. Therefore, the chip size of the output power MOSFET can be reduced. Also, the N$^+$ diffusion layer region 16 and the N-type diffusion layer region 72 to connect the battery voltage $V_{BAT}$ of the P-type diffusion layer regions 13 and 63 are in an optional locations of the N$^+$ semiconductor substrate 11. Therefore, the influence of the resistance in the electrode layer like the aluminum interconnection becomes able to be reduced. That is, by reducing the parasitic current while suppressing the increase of the circuit area, the power consumption can be reduced.

As described above, the embodiments of the present invention have been described specifically. However, the present invention is not limited to the embodiments and various change and modifications are in the range of the present invention which does not deviate from the scope of the present invention.

Also, it is possible for the technique of each embodiment to be applied to the other embodiments in a range of no contradiction. For example, the techniques of the first to third embodiments can be applied to the fourth embodiment. Also, each when each output power MOSFET is a P-channel low-side output power MOSFET, the technique of each embodiment can be applied in the same way by exchanging the conductive types.

What is claimed is:

1. A semiconductor device comprising:
   a semiconductor chip; and
   a control chip configured to control said semiconductor chip,
   wherein said semiconductor device comprises:
      a first semiconductor layer in which a first conductive type impurity is heavily doped;
      a second semiconductor layer in which the first conductive type impurity is lightly doped and which is joined onto said first semiconductor layer;
      a first power transistor having a channel of the first conductive type and formed in a surface region of said second semiconductor layer;
      a transistor formed in a surface region of said second semiconductor layer; and
      a first diffusion layer region of a second conductive type formed in a surface region of said second semiconductor layer to separate said first power transistor from said transistor,
   wherein said first semiconductor layer functions as a drain of said first power transistor, and
   wherein said first diffusion layer region is set to the same voltage as that of said drain.

2. The semiconductor device according to claim 1, wherein the first conductive type is an N-type, and the second conductive type is a P-type, and
   wherein said first diffusion layer region is set to a relatively high power supply voltage.

3. The semiconductor device according to claim 1, wherein said transistor is a second power transistor having the first conductive type channel and formed in a surface region of said second semiconductor layer and said first semiconductor layer functions as the drain of said second power transistor.

4. The semiconductor device according to claim 1, wherein said transistor is at least one of a planar-type of transistor having the first conductive type channel and a planar-type transistor having a second conductive type channel, which are formed in a surface region of the second semiconductor layer.

5. The semiconductor device according to claim 1, further comprising:
   an electrode layer connected with said first diffusion layer region and extending along said first diffusion layer region; and
   a second diffusion layer region of the first conductive type formed in a surface region of said second semiconductor layer and connected with an interconnection layer.

6. The semiconductor device according to claim 1, further comprising:
   an electrode layer connected with said first diffusion layer region and extending along said first diffusion layer region; and
   a second diffusion layer region of the first conductive type formed in a surface region of said second semiconductor layer along a side of said first diffusion layer region which is opposite to said first power transistor, to be connected with said electrode layer.

7. The semiconductor device according to claim 3, further comprising:
   a plurality of power transistors which include said first power transistor and said second power transistor,
   wherein said first semiconductor layer functions as drains of said plurality of power transistors, and
   wherein said first diffusion layer region is formed to provide a boundary between sources of adjacent two power transistors of said plurality of power transistors.

8. The semiconductor device according to claim 1, wherein said first power transistor comprises a base diffusion layer of the second conductive type functioning as a channel, and
   wherein a diffusion depth of said first diffusion layer region is substantially the same as the diffusion depth of said base diffusion layer.

9. The semiconductor device according to claim 1, wherein said first power transistor comprises:
   a base diffusion layer of a second conductive type functioning a channel; and
   a well diffusion layer provided to surround said base diffusion layer, and wherein a diffusion depth of said first diffusion layer region is substantially the same as the diffusion depth of said well diffusion layer.

10. The semiconductor device according to claim 1, wherein said first power transistor comprises:
   a base diffusion layer of a second conductive type functioning a channel;
   a gate formed to pass through said base diffusion layer from a surface side to an internal side; and
   a source of the first conductive type formed on a side of said gate in a surface region of said base diffusion layer.

11. An intelligent power device comprising:
   a semiconductor chip to be coupled to a load; and
   a control chip configured to control said semiconductor chip,
   wherein said semiconductor chip comprises:
      a first semiconductor layer in which a first conductive type impurity is heavily doped;
      a second semiconductor layer in which the first conductive type impurity is lightly doped and which is joined onto said first semiconductor layer;
      a first power transistor having a channel of the first conductive type and formed in a surface region of said second semiconductor layer;
      a transistor formed in a surface region of said second semiconductor layer; and
      a first diffusion layer region of a second conductive type formed in a surface region of said second semiconductor layer to separate said first power transistor from said transistor,
   wherein said first semiconductor layer functions as a drain of said first power transistor, and
   wherein said first diffusion layer region is set to the same voltage as that of said drain.

12. The intelligent power device according to claim 11, wherein said load includes a lamp.

13. An intelligent power device comprising:
   a semiconductor chip; and
   a motor coupled to said semiconductor chip,
   wherein said semiconductor chip comprises:
      a first semiconductor layer in which a first conductive type impurity is heavily doped;
      a second semiconductor layer in which the first conductive type impurity is lightly doped and which is joined onto said first semiconductor layer;
      a first power transistor having a channel of the first conductive type and formed in a surface region of said second semiconductor layer;
      a transistor formed in a surface region of said second semiconductor layer; and
      a first diffusion layer region of a second conductive type formed in a surface region of said second semiconductor layer to separate said first power transistor from said transistor,
   wherein said first semiconductor layer functions as a drain of said first power transistor, and
   wherein said first diffusion layer region is set to the same voltage as that of said drain.

14. The intelligent power device according to claim 13, wherein said transistor is a second power transistor having the first conductive type channel and formed in a surface region of said second semiconductor layer and said first semiconductor layer functions as the drain of said second power transistor.

15. The intelligent power device according to claim 14, wherein one end of said motor is coupled to said first power transistor and another end of said motor is coupled to said second power transistor.

16. The intelligent power device according to claim 13, further comprising:
   a controller configured to control said semiconductor chip.

* * * * *